(12) United States Patent
Shao et al.

(10) Patent No.: US 9,941,160 B2
(45) Date of Patent: Apr. 10, 2018

(54) INTEGRATED CIRCUITS HAVING DEVICE CONTACTS AND METHODS FOR FABRICATING THE SAME

(71) Applicant: GLOBALFOUNDRIES Singapore Pte. Ltd., Singapore (SG)

(72) Inventors: Wei Shao, Singapore (SG); Fan Zhang, Singapore (SG); Vish Srinivasan, Singapore (SG)

(73) Assignee: GLOBALFOUNDRIES SINGAPORE PTE. LTD., Singapore (SG)

( * ) Notice: Subject to any disclaimer, the term of this patent is extended or adjusted under 35 U.S.C. 154(b) by 649 days.

(21) Appl. No.: 13/950,366

(22) Filed: Jul. 25, 2013

(65) Prior Publication Data

US 2015/0028490 A1    Jan. 29, 2015

(51) Int. Cl.
  *H01L 21/44*   (2006.01)
  *H01L 23/485*   (2006.01)
  *H01L 21/768*   (2006.01)

(52) U.S. Cl.
  CPC .. *H01L 21/76897* (2013.01); *H01L 21/76847* (2013.01); *H01L 23/485* (2013.01); *H01L 21/76877* (2013.01); *H01L 2924/0002* (2013.01)

(58) Field of Classification Search
  CPC ..... H01L 21/76879; H01L 2924/01078; H01L 21/76898; H01L 27/10888; H01L 21/2855; H01L 21/76807; H01L 21/76843; H01L 21/743; H01L 21/76847; H01L 23/485

USPC .......... 257/E27.06, 334, 337, 369, 751, 755, 257/758, 762, 773, 774, 778; 438/630, 438/636, 637, 639, 643, 648–651, 667, 438/672, 675, 627, 687, 629
See application file for complete search history.

(56) References Cited

U.S. PATENT DOCUMENTS

| 5,356,836 | A   | * | 10/1994 | Chen ...................... H01L 21/743 204/192.17 |
| 7,737,554 | B2  |   | 6/2010  | Xu |
| 2005/0023701 | A1 | * | 2/2005 | Kajita ............... H01L 21/76843 257/774 |
| 2005/0032368 | A1 | * | 2/2005 | Li ....................... H01L 21/2855 438/687 |
| 2005/0153537 | A1 | * | 7/2005 | Cheng ............... H01L 21/76807 438/627 |
| 2008/0217775 | A1 | * | 9/2008 | Pai .................... H01L 21/76877 257/751 |
| 2011/0204518 | A1 |   | 8/2011  | Arunachalam |

* cited by examiner

*Primary Examiner* — Matthew Reames
*Assistant Examiner* — Young W Kim
(74) *Attorney, Agent, or Firm* — Lorenz & Kopf, LLP

(57) ABSTRACT

Integrated circuits and methods for fabricating integrated circuits are provided. In one example, a method for fabricating an integrated circuit includes forming a conductive plug that at least partially fills a contact seam void. The contact seam void is formed in a contact that extends through an ILD layer of dielectric material overlying a device region. A metallization layer is deposited overlying the contact.

20 Claims, 4 Drawing Sheets

INTEGRATED CIRCUITS HAVING DEVICE CONTACTS AND METHODS FOR FABRICATING THE SAME

TECHNICAL FIELD

The technical field relates generally to integrated circuits and methods for fabricating integrated circuits, and more particularly relates to integrated circuits having device contacts and methods for fabricating such integrated circuits.

BACKGROUND

Conductive contacts are formed to electrically connect various semiconductor devices (e.g., source/drain regions of metal oxide semiconductor field effect transistors (MOSFETs) or MOS transistors) of integrated circuits (ICs). The contacts are conventionally formed by patterning and etching a dielectric material layer to form a contact opening, depositing a liner/barrier layer, typically a combination of layers, such as titanium (Ti), tantalum (Ta), ruthenium (Ru), titanium nitride (TiN), tantalum nitride (TaN), tungsten nitride (WN), and/or cobalt (Co) to line the side surfaces and bottom of the contact opening, and depositing a conductive material, such as tungsten (W) or copper (Cu) to fill the contact opening. The liner-barrier prevents diffusion of the conductive material into the dielectric material layer and enhances adhesion of the conductive material to the walls of the contact opening.

An example of typical electrical connections formed by contacts is between a semiconductor device in a device region of the IC and a metallization layer (e.g., bottom metallization layer disposed above the device region commonly referred to as a M1 layer). The contact is electrically connected at one end to the semiconductor device as described above by forming the contact opening through the dielectric material layer to the device region and depositing the liner/barrier layer and conductive material. Similarly, the contact is electrically connected at the other end to the metallization layer by depositing a second dielectric material layer overlying the contact and the first dielectric material layer, forming a metallization trench to expose the contact, and subsequently depositing a liner/barrier layer and a metallization layer (e.g., copper (Cu)) to fill the metallization trench.

As feature sizes decrease from 150 nanometers (nm) to 90 nm, then to 45 nm and below (e.g., 32 nm, 20 nm, and below), the aspect ratio (e.g., height to diameter/width) of contacts and their corresponding contact openings substantially increase. As such, filling the contact openings with conductive material can be more challenging and lead to poor fill with large seam voids and higher resistance. Additionally, it has been found that when such ICs are electrically stressed, the metallization layer can undesirably breakthrough the liner/barrier layer above a large seam void and diffuse through the contact to the contact-device region interface which can impact the reliability of the IC.

Accordingly, it is desirable to provide integrated circuits having device contacts with improved robustness and methods for fabricating such integrated circuits. Furthermore, other desirable features and characteristics of the present invention will become apparent from the subsequent detailed description and the appended claims, taken in conjunction with the accompanying drawings and this background.

BRIEF SUMMARY

Integrated circuits and methods for fabricating integrated circuits are provided herein. In accordance with an exemplary embodiment, a method for fabricating an integrated circuit includes forming a conductive plug that at least partially fills a contact seam void. The contact seam void is formed in a contact that extends through an ILD layer of dielectric material overlying a device region. A metallization layer is deposited overlying the contact.

In accordance with another exemplary embodiment, a method for fabricating an integrated circuit is provided. The method includes filling a contact opening with conductive material to form a contact. The contact opening is formed in a first ILD layer of dielectric material that overlies a device region. The conductive material is planarized to expose a contact seam void formed in the contact. Ti and/or TiN is deposited to at least partially fill the contact seam void and define a conductive plug. A second ILD layer of dielectric material is deposited overlying the first ILD layer and the contact. The second ILD layer is etched to form a sidewall that defines a metallization trench to expose the contact. A liner is formed in the metallization trench overlying the sidewall and the contact. A metallization layer is plated in the metallization trench overlying the liner.

In accordance with another exemplary embodiment, an integrated circuit is provided. The integrated circuit includes a device region. An ILD layer of dielectric material overlies the device region. A contact extends through the ILD layer to the device region. The contact has a contact seam void formed therein. A conductive plug at least partially fills the contact seam void.

BRIEF DESCRIPTION OF THE DRAWINGS

The various embodiments will hereinafter be described in conjunction with the following drawing figures, wherein like numerals denote like elements, and wherein.

DETAILED DESCRIPTION

Figure 1:
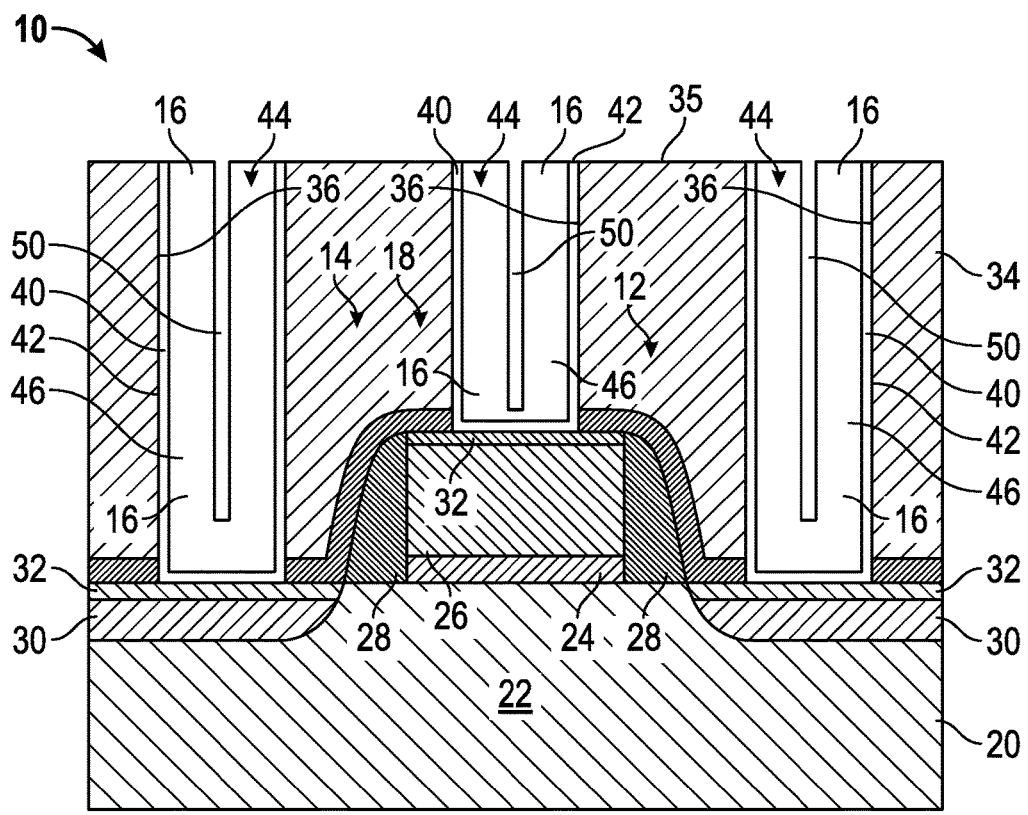
FIG. 1 illustrates, in cross-sectional view, an integrated circuit during an intermediate fabrication stage in accordance with an exemplary embodiment.

The following Detailed Description is merely exemplary in nature and is not intended to limit the various embodiments or the application and uses thereof. Furthermore, there is no intention to be bound by any theory presented in the preceding background or the following detailed description.

Various embodiments contemplated herein relate to integrated circuits having device contacts and methods for fabricating integrated circuits having device contacts. During intermediate stages of fabrication of an integrated circuit (IC), a contact opening is etched into a first interlayer dielectric (ILD) layer of dielectric material that overlies a device region of the IC. In an exemplary embodiment, a liner of barrier material, e.g., Ti and/or TiN, is formed in the contact opening and the contact opening is filled with conductive material to form a contact. A contact seam void is formed in the contact and the contact is planarized to expose the contact seam void.

In an exemplary embodiment, Ti and/or TiN is deposited overlying the first ILD layer, the contact, and the exposed contact seam void to form a Ti/TiN layer overlying the first ILD layer and at least partially filling the contact seam void with Ti and/or TiN. The Ti/TiN disposed in the contact seam void forms a conductive plug in the contact. The Ti/TiN layer is planarized to expose the contact with the Ti/TiN plug and the first ILD layer.

A second ILD layer of dielectric material is deposited overlying the first ILD layer and the contact. The second ILD layer is etched to form a sidewall that defines a metallization trench that exposes the contact. In an exemplary embodiment, a liner of barrier material, e.g., Ta and/or TaN, is formed in the metallization trench overlying the sidewall and the contact. A metallization layer is formed, for example by electrical-chemical plated Cu, in the metallization trench overlying the liner. It has been found that by at least partially filling the contact seam void with Ti and/or TiN to form the conductive plug, the contact is more robust such that, for example, during electrical stressing of the IC, the metallization layer does not breakthrough the liner/barrier layer and diffuse through the contact seam void to the contact-device region interface. Moreover, the conductive plug promotes lower resistance of the contact improving overall robustness of the contact.

FIGS. 1-4 illustrate, in cross-sectional view, an IC 10 during various fabrication stages. The IC 10 includes a semiconductor device 12 that is disposed along a device region 14 with contacts 16, e.g., device contacts, in accordance with various embodiments. The described process steps, procedures, and materials are to be considered only as exemplary embodiments designed to illustrate to one of ordinary skill in the art methods for practicing the invention; the invention is not limited to these exemplary embodiments. The illustrated portions of the IC 10 include only a single semiconductor device 12, although those of ordinary skill in the art will recognize that an actual IC can include a large number of such semiconductor devices. The semiconductor device 12 may be a diode, a bipolar transistor, a MOS device, or the like. For purposes of illustration, FIGS. 1-4 illustrate the semiconductor device 12 as a MOS device. Various steps in the manufacture of ICs and MOS devices are well known and so, in the interest of brevity, many conventional steps will only be mentioned briefly herein or will be omitted entirely without providing the well-known process details. Although the term "MOS device" properly refers to a semiconductor device having a metal gate electrode and an oxide gate insulator, that term will be used throughout to refer to any semiconductor device that includes a conductive gate electrode (whether metal or other conductive material) that is positioned over a gate insulator (whether oxide or other insulator) which, in turn, is positioned over a semiconductor substrate.

FIG. 1 illustrates a portion of the IC 10 at an intermediate stage of fabrication in accordance with an exemplary embodiment. As illustrated, the semiconductor device 12 is a MOS transistor 18, which can be N-channel or P-channel MOS transistor. The MOS transistor 18 is fabricated on a silicon substrate 20, which can be either a bulk silicon wafer as illustrated or a thin silicon layer on an insulating substrate (SOI). As used herein, the terms "silicon layer" and "silicon substrate" will be used to encompass the relatively pure or lightly impurity-doped monocrystalline silicon materials typically used in the semiconductor industry as well as silicon admixed with other elements such as germanium, carbon, and the like to form a substantially monocrystalline semiconductor material. At least a surface portion 22 of the silicon substrate 20 is doped with P-type conductivity-determining impurities for the fabrication of a N-channel MOS transistor or with N-type conductivity-determining impurities for the fabrication of a P-channel MOS transistor. The surface portion 22 can be impurity doped, for example, by the implantation and subsequent thermal annealing of dopant ions such as boron or arsenic ions.

A layer of gate insulating material 24 is formed at the surface of the surface portion 22 and a gate electrode 26 is formed overlying the layer of gate insulating material 24 and the surface portion 22. The layer of gate insulating material 24 can be a layer of thermally grown silicon dioxide, or alternatively, a deposited insulator such as a silicon oxide, silicon nitride, a high dielectric constant insulator such as hafnium silicate ($HfSiO_x$, where x is greater than zero), or the like. The deposited insulators can be deposited, for example, by chemical vapor deposition (CVD), low pressure chemical vapor deposition (LPCVD), or plasma enhanced chemical vapor deposition (PECVD). The layer of gate insulating material 24 may have a thickness of from about 1 to about 10 nm, although the actual thickness can be determined based on the application of the transistor in the circuit being implemented. The gate electrode 26 includes an electrically conductive material, such as a metal or metal alloy, or a material that can be made electrically conductive and formed by depositing, patterning, and etching, for example, a layer of polycrystalline silicon, such as a layer of undoped polycrystalline silicon. The gate electrode 26 generally has a thickness of from about 50 to about 300 nm. The polycrystalline silicon can be deposited, for example, by the reduction of silane in a CVD reaction.

Sidewall spacers 28 are formed on the sidewalls of the gate electrode 26. The sidewall spacers 28 are formed by depositing a layer of insulating material such as silicon oxide and/or silicon nitride and subsequently anisotropically etching the insulating layer, for example by reactive ion etching (RIE). Alternatively, silicon oxide and silicon nitride can be etched, for example, in a $CHF_3$, $CF_4$, or $SF_6$ chemistry.

Conductivity-determining ions are implanted into the silicon substrate 20 to form source and drain regions 30. If the surface portion 22 of the silicon substrate 20 is P-type, N-type conductivity-determining ions are implanted to form N-type source and drain regions in the silicon substrate 20 and to conductivity dope the gate electrode 26 with N-type impurities. The implanted ions can be, for example, either phosphorus or arsenic ions. Alternatively, if the surface portion 22 of the silicon substrate 20 is N-type, P-type conductivity-determining ions are implanted to form P-type source and drain regions in the silicon substrate 20 and to conductivity dope the gate electrode 26 with P-type impurities. The implanted ions can be, for example, boron ions. The source and drain regions 30 are self-aligned with the gate electrode 26. As those of skill in the art will appreciate, additional sidewall spacers and additional implantations may be employed to create drain extensions, halo implants, deep source and drains, and the like.

In accordance with an exemplary embodiment, a layer of silicide-forming metal (not shown) is deposited over the device region 14 and in contact with the source and drain regions 30 and the gate electrode 26. Examples of silicide-forming metals include, but are not limited to, nickel, cobalt, and alloys thereof. The silicide-forming metal can be deposited, for example by sputtering, to a thickness of from about 4 to about 50 nm, such as about 10 nm. In one embodiment, the device region 14 with the silicide-forming metal is heated, for example by RTA, to cause the silicide-forming metal to react with exposed silicon to form metal silicide regions 32 at the surface of the source and drain regions 30 and the gate electrode 26. The metal silicide forms only in those areas where there is exposed silicon. Metal silicide does not form, and the silicide forming metal remains unreacted, in those areas where there is no exposed silicon, such as on the sidewall spacers 28. The unreacted silicide-forming metal can be removed by wet etching in a $H_2O_2/H_2SO_4$ or $HNO_3/HCl$ solution.

After the formation of metal silicide regions 32, an ILD layer 34 of insulating material (e.g., dielectric material such as silicon oxide) is deposited overlying the device region 14. In an exemplary embodiment, the ILD layer 34 is deposited by a low temperature process and may be deposited, for example by a LPCVD process.

In an exemplary embodiment, a top surface 35 of the ILD layer 34 is planarized, for example by a chemical mechanical planarization (CMP) process. The ILD layer 34 is etched to form sidewalls 36 that correspondingly define contact openings 38 (e.g., vias) formed through the ILD layer 34 exposing the metal silicide regions 32. The contact openings 38 expose portions of the metal silicide regions 32 on the source and drain regions 30 and the gate electrode 26. Depending on the circuit being implemented, however, the contact opening 38 to the gate electrode 26 may or may not be formed.

In an exemplary embodiment, a liner-forming material(s) 40 is deposited overlying the top surface 35 of the ILD layer 34 (which is subsequently removed by a CMP process), the sidewalls 36, and the metal silicide regions 32 to define liners 42 correspondingly disposed in the contact openings 38. In an exemplary embodiment, the liner forming material 40 is formed by depositing Ti and/or TiN to form one or more barrier layers that define the liners 42. As illustrated, the liners 42 are formed directly on the sidewalls 36 and the metal silicide regions 32 and define inner cavities 44 correspondingly in the contact openings 38.

A conductive material 46 is deposited into the inner cavities 44 overlying the liners 42 to fill the contact openings 38 and form contacts 16. In an exemplary embodiment, the conductive material 46 is W although other conductive materials known to those skilled in the art may also be used to form the contacts 16. The conductive material 46 may be deposited using well known deposition techniques such as CVD. As illustrated, the contacts 16 have contact seam voids 50 formed therein. In an exemplary embodiment, any excess conductive material 46, for example dispose above the ILD layer 34, is removed and the contact seam voids are exposed by planarizing the conductive material using for example a CMP process.

Figure 2:
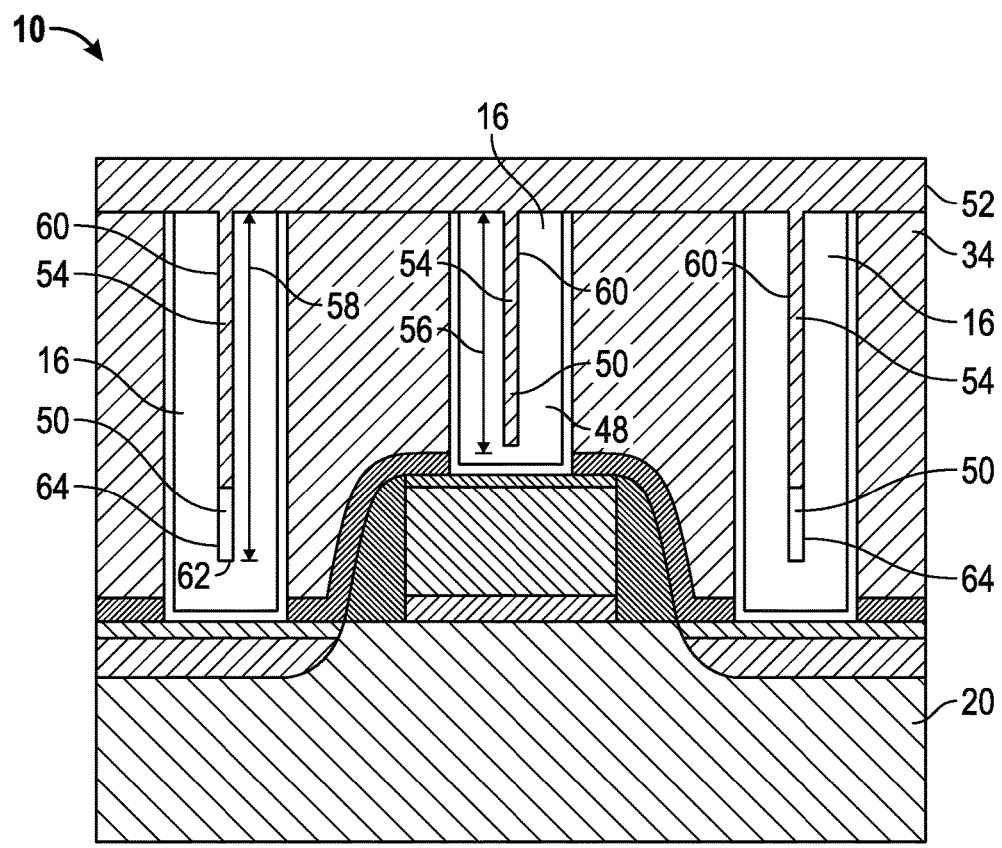
FIG. 2 illustrates, in cross-sectional view, an integrated circuit during a further advanced fabrication stage in accordance with an exemplary embodiment.
Figure 3:
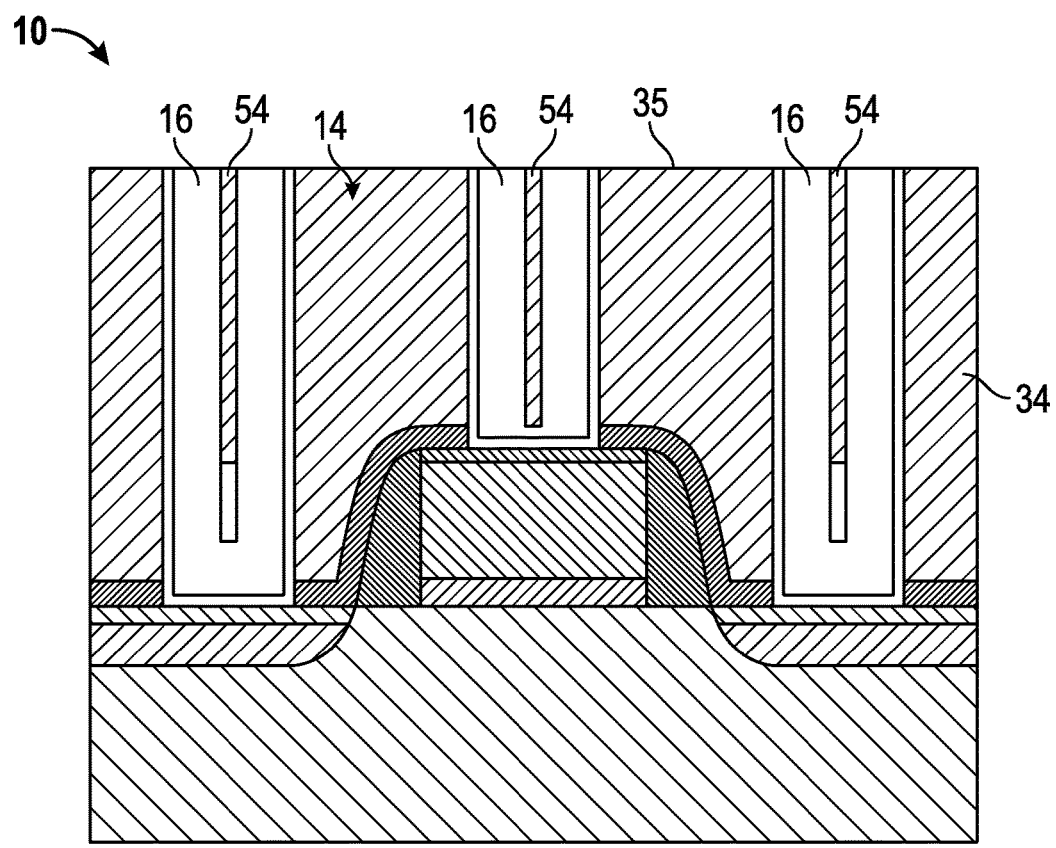
FIG. 3 illustrates, in cross-sectional view, an integrated circuit during a further advanced fabrication stage in accordance with an exemplary embodiment.

FIGS. 2 and 3 illustrate the IC 10 at further advanced fabrication stages in accordance with an exemplary embodiment. A relatively thin layer of Ti and/or TiN is deposited to at least partially fill the contact seam voids 50 and to form a Ti/TiN layer 52 overlying the ILD layer 34 and the contacts 16. In an exemplary embodiment, the Ti/TiN layer 52 has a thickness of from about 3 to about 20 nm, for example from about 5 to about 10 nm. The Ti and/or TiN that at least partially fills the contact seam voids 50 forms conductive plugs 54. In an exemplary embodiment, a thermal chemical vapor deposition (CVD) process is used to form TiN and is followed immediately by physical vapor deposition (PVD) process to deposit Ti to facilitate filling the relatively high aspect ratio contact seam voids 50. In an exemplary embodiment, the conductive plugs 54 fill at least about 50% of the depths (indicated by double headed arrows 56 and 58) of the contact seam voids 50, such as from about 50 to about 100%, for example from about 75 to about 100% or alternatively from about 50 to about 75% of the depths of the contact seam voids 50. In an exemplary embodiment, the conductive plugs 54 fill upper portions 60 of the contact seam voids 50 and may be spaced apart from lower-most portions 62 of the contact seam voids 50 to correspondingly define an enclosed space 64 that is disposed beneath a particular conductive plug 54. It has been found that by filling at least about 50% of the depth of a corresponding contact seam void 50 such as the upper portion 60, the conductive plug functions as a suitable barrier for diffusion of a metallization layer as will be described in further detail below.

The process continues as illustrated in FIG. 3 by planarizing the Ti/TiN layer 52 (shown in FIG. 2) to expose the top surface 35 of the ILD layer 34 and the contacts 16 including the conductive plugs 54. In an exemplary embodiment, the Ti/TiN layer 52 (shown in FIG. 2) is planarized by using a CMP process, such as a mild CMP process (e.g., by turning down the polish pad down-force and optimizing the polishing time) to remove the Ti/TiN layer 52 and expose the contact surface without disrupting or damaging the conductive plugs 54.

Figure 4:
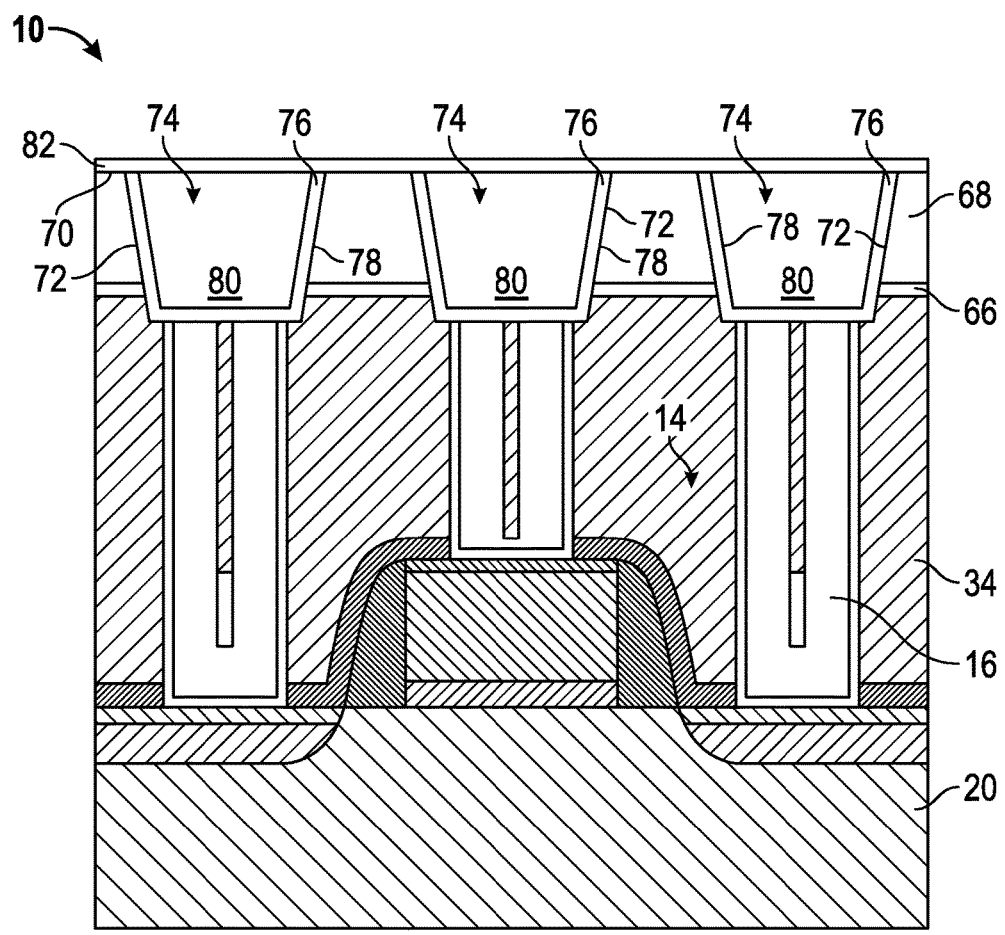
FIG. 4 illustrates, in cross-sectional view, an integrated circuit during a further advanced fabrication stage in accordance with an exemplary embodiment.

FIG. 4 illustrates the IC 10 at a further advanced fabrication stage in accordance with an exemplary embodiment. The process continues by optionally depositing an etch stop layer 66 formed of, for example, a nitride material, e.g., silicon nitride. An ILD layer 68 is deposited overlying the ILD layer 34 and the etch stop layer 66, for example, by a LPCVD process. A top surface 70 of the ILD layer 68 is planarized, for example, by a CMP process. As illustrated, the ILD layer 68, the etch stop layer 66, and upper portions of the ILD layer 34 and the contacts 16 are etched to form sidewalls 72 that define metallization trenches 74 that expose the contacts 16.

In an exemplary embodiment, a liner-forming material(s) 76 is deposited overlying the top surface 70 of the ILD layer 68 (which is subsequently removed by a CMP process), the sidewalls 72, and the contacts 16 to define liners 78 correspondingly disposed in the metallization trenches 74. In an exemplary embodiment, the liner forming material 76 is formed by depositing Ti and/or TiN to form one or more barrier layers that define the liners 78.

Copper (Cu) or other conductive material is deposited overlying the liners 78 to form metallization layers 80. In an exemplary embodiment, the metallization layers 80 are formed by selectively depositing Cu using an electrochemical plating (ECP) process. As illustrated, an N-doped silicon carbide (SiCN) layer 82 is deposited overlying the metallization layers 80 and the expose portions of the ILD layer 68 to form a protective cap layer.

Accordingly, integrated circuits including devices and methods for fabricating such integrated circuits have been described. In an exemplary embodiment, an integrated circuit is fabricated by forming a conductive plug of Ti and/or TiN that at least partially fills an exposed contact seam void formed in a contact. The contact extends through an ILD layer of dielectric material that overlies a device region of the integrated circuit. In an exemplary embodiment, a liner is formed overlying the ILD layer and the contact and a metallization layer is deposited overlying the liner.

While at least one exemplary embodiment has been presented in the foregoing detailed description of the disclosure, it should be appreciated that a vast number of variations exist. It should also be appreciated that the exemplary embodiment or exemplary embodiments are only examples, and are not intended to limit the scope, applicability, or configuration of the disclosure in any way. Rather, the foregoing detailed description will provide those skilled in the art with a convenient road map for implementing an exemplary embodiment of the disclosure. It being understood that various changes may be made in the function and arrangement of elements described in an exemplary embodiment without departing from the scope of the disclosure as set forth in the appended claims.

What is claimed is:

1. A method for fabricating an integrated circuit having a device contact, the method comprising;
   providing a contact that extends through an ILD layer of dielectric material overlying a device region, the contact comprising seam void;
   forming a conductive plug that partially fills the seam void formed such that the conductive plug fills an upper portion of the contact seam void and leaves a lower-most portion of the seam void unfilled forming an enclosed space between the conductive plug and the lower-most portion of the contact; and
   depositing a metallization layer overlying the contact.

2. The method of claim 1, wherein forming the conductive plug comprises filling at least about 50% of a depth of the contact seam void with the conductive plug.

3. The method of claim 2, wherein forming the conductive plug comprises filling from about 50 to about 75% of the depth of the contact seam void with the conductive plug.

4. The method of claim 1, wherein forming the conductive plug comprises filling an upper portion of the contact seam void with the conductive plug.

5. The method of claim 4, wherein forming the conductive plug comprises forming the conductive plug such that the conductive plug is disposed in the upper portion spaced apart from a lower-most portion of the contact seam void.

6. The method of claim 1, further comprising forming a liner overlying and in direct contact with both the contact and the conductive plug, wherein depositing the metallization layer comprises depositing the metallization layer overlying the liner.

7. The method of claim 6, wherein forming the liner comprises depositing Ti and/or TiN overlying the contact to form the liner.

8. The method of claim 1, wherein depositing the metallization layer comprises depositing Cu using an ECP process to form the metallization layer.

9. The method of claim 1, wherein forming the conductive plug comprises forming the conductive plug that comprises Ti, TiN, or a combination thereof.

10. A method for fabricating an integrated circuit having a device contact, the method comprising:
    filling a contact opening with conductive material to form a contact, wherein the contact opening is formed in a first ILD layer of dielectric material that overlies a device region, optionally with a liner disposed between the contact and the ILD layer;
    planarizing the conductive material to expose a contact seam void formed in the contact;
    depositing Ti and/or TiN to form a Ti/TiN layer that partially fills the contact seam void to define a conductive plug and that overlies the contact and the first ILD layer such that the conductive plug fills an upper portion of the contact seam void and leaves a lower-most portion of the seam void unfilled forming an enclosed space between the conductive plug and the lower-most portion of the contact; and depositing a metallization layer overlying the contact;
    depositing a second ILD layer of dielectric material overlying the first ILD layer and the contact;
    etching the second ILD layer to form a sidewall that defines a metallization trench to expose both the contact and the conductive plug;
    forming a liner in the metallization trench overlying the sidewall and the contact, wherein the liner is in direct contact with both the contact and the conductive plug; and
    plating a metallization layer in the metallization trench overlying the liner.

11. The method of claim 10, wherein filling the contact opening comprises filling the contact opening with W to form the contact.

12. The method of claim 10, wherein planarizing the conductive material comprises planarizing the conductive material using a CMP process.

13. The method of claim 10, wherein depositing Ti and/or TiN comprises depositing Ti and/or TiN using a PVD process.

14. The method of claim 10, further comprising depositing an etch stop layer overlying the first ILD layer and the contact, wherein depositing the second ILD layer comprises depositing the second ILD layer overlying the etch stop layer, and wherein etching the second ILD layer comprises etching through the second ILD layer and the etch stop layer to expose the contact.

15. The method of claim 10, further comprising depositing an N-doped silicon carbide (SiCN) layer overlying the second ILD layer and the metallization layer.

16. The method of claim 10, wherein depositing Ti and/or TiN further comprises forming a Ti/TiN layer overlying the first ILD layer and the contact.

17. The method of claim 16, wherein depositing Ti and/or TiN comprises forming the Ti/TiN layer having a thickness of from about 3 to about 20 nm.

18. The method of claim 16, further comprising planarizing the Ti/TiN layer to expose the contact prior to depositing the second ILD layer.

19. The method of claim 18, wherein planarizing the Ti/TiN layer comprises planarizing the Ti/TiN layer using a mild CMP process.

20. An integrated circuit having a device contact, the integrated circuit comprising:
    a device region;
    an ILD layer of dielectric material overlying the device region;
    a contact extending through the ILD layer to the device region, wherein the contact has a contact seam void formed therein; and
    a conductive plug that at least partially fills the contact seam void.

* * * * *